US010459055B2

(12) United States Patent
Griswold et al.

(10) Patent No.: US 10,459,055 B2
(45) Date of Patent: Oct. 29, 2019

(54) SYSTEM AND METHOD FOR REDUCED FIELD OF VIEW MR FINGERPRINTING FOR PARAMETRIC MAPPING

(71) Applicant: Case Western Reserve University, Cleveland, OH (US)

(72) Inventors: Mark A. Griswold, Shaker Heights, OH (US); Yun Jiang, Cleveland Heights, OH (US)

(73) Assignee: Case Western Reserve University, Cleveland, OH (US)

( * ) Notice: Subject to any disclaimer, the term of this patent is extended or adjusted under 35 U.S.C. 154(b) by 15 days.

(21) Appl. No.: 15/945,594

(22) Filed: Apr. 4, 2018

(65) Prior Publication Data
US 2018/0292493 A1   Oct. 11, 2018

Related U.S. Application Data

(60) Provisional application No. 62/482,749, filed on Apr. 7, 2017.

(51) Int. Cl.
| *G01R 33/561* | (2006.01) |
| *G01R 33/56* | (2006.01) |
| *G01R 33/50* | (2006.01) |
| *G06T 7/00* | (2017.01) |
| *G01R 33/483* | (2006.01) |
| *G01R 33/54* | (2006.01) |

(52) U.S. Cl.
CPC ....... *G01R 33/561* (2013.01); *G01R 33/4835* (2013.01); *G01R 33/50* (2013.01); *G01R 33/56* (2013.01); *G06T 7/0012* (2013.01); *G01R 33/543* (2013.01); *G06T 2207/10088* (2013.01)

(58) Field of Classification Search
CPC .. G01R 33/4835; G01R 33/50; G01R 33/543; G01R 33/56; G01R 33/561; G06T 7/0012; G06T 7/10088
See application file for complete search history.

(56) References Cited

U.S. PATENT DOCUMENTS

| 8,723,518 B2 | 5/2014 | Seiberlich |
| 2012/0235678 A1 | 9/2012 | Seiberlich |
| 2015/0301141 A1 | 10/2015 | Griswold |

(Continued)

OTHER PUBLICATIONS

Ma D., et al., in "Magnetic Resonance Fingerprinting," Nature, 2013; 495(7440): 187-192.

*Primary Examiner* — Gregory H Curran
(74) *Attorney, Agent, or Firm* — Quarles & Brady LLP; Jack M. Cook (57) ABSTRACT

The present disclosure provides systems and methods for magnetic resonance fingerprinting (MRF). The method including steps comprising acquiring a plurality of MRF signals from a plurality of excitation volumes within a subject, wherein at least two of the plurality of excitation volumes differ in location within the subject, and wherein each of the excitation volumes partially overlap to form an overlap volume. The method also includes comparing the plurality of MRF signals acquired from the overlap volume with a dictionary of signal evolutions, determining one or more physical parameters of the overlap volume within the subject, and generating a report at least indicating the one or more physical parameters of the overlap volume within the subject.

15 Claims, 5 Drawing Sheets

(56) References Cited

U.S. PATENT DOCUMENTS

2016/0166559 A1* 6/2016 Sonesson .............. C07B 59/002
 514/317
2017/0307706 A1* 10/2017 Cloos ................. G01R 33/4835
2018/0074148 A1* 3/2018 Pfeuffer ............. G01R 33/4818

* cited by examiner

SYSTEM AND METHOD FOR REDUCED FIELD OF VIEW MR FINGERPRINTING FOR PARAMETRIC MAPPING

CROSS-REFERENCE TO RELATED APPLICATIONS

This application is based on, claims priority to, and incorporates herein by reference for all purposes US Provisional Application Ser. No. 62/482,749, filed Apr. 7, 2017, and entitled "REDUCED FIELD OF VIEW MR FINGERPRINTING FOR HIGH-RESOLUTION PARAMETRIC MAPPING."

STATEMENT REGARDING FEDERALLY SPONSORED RESEARCH

N/A

BACKGROUND

Characterizing tissue species using nuclear magnetic resonance ("NMR") can include selecting a particular property of a resonant species (e.g., T1 spin-lattice relaxation, T2 spin-spin relaxation, proton density) and then assessing anatomical images having a weighting toward the selected property to make clinical assessments of the tissue. In this way, assessments are qualitative and limited to the information provided by the particular weighting of the data/image. Magnetic resonance fingerprinting ("MRF"), which is described, as one example, by D. Ma, et al., in "Magnetic Resonance Fingerprinting," *Nature*, 2013; 495(7440):187-192, breaks from the traditional paradigm of NMR or magnetic resonance imaging ("MRI") to acquire data from a resonant species across a variety of properties and provides a framework to quantitatively assess the data.

Conventional MRI pulse sequences include repetitive similar preparation phases, waiting phases, and acquisition phases that serially produce signals from which images can be made. The preparation phase determines when a signal can be acquired and determines the properties of the acquired signal. For example, a first pulse sequence may produce a T1-weighted signal at a first echo time ("TE"), while a second pulse sequence may produce a T2-weighted signal at a second TE. These conventional pulse sequences typically provide qualitative results where data are acquired with various weightings or contrasts that highlight a particular parameter (e.g., T1 relaxation, T2 relaxation).

When magnetic resonance ("MR") images are generated, they may be viewed by a radiologist and/or surgeon who interprets the qualitative images for specific disease signatures. The radiologist may examine multiple image types (e.g., T1-weighted, T2-weighted) acquired in multiple imaging planes to make a diagnosis. The radiologist or other individual examining the qualitative images may need particular skill to be able to assess changes from session to session, from machine to machine, and from machine configuration to machine configuration.

Unlike conventional MRI, MRF employs a series of varied sequence blocks that simultaneously produce different signal evolutions in different resonant species (e.g., tissues) to which the radio frequency ("RF") is applied. The signals from different resonant tissues will, however, be different and can be distinguished using MRF. The different signals can be collected over a period of time to identify a signal evolution for the volume. Resonant species in the volume can then be characterized by comparing the signal evolution to known evolutions. Characterizing the resonant species may include identifying a material or tissue type, or may include identifying MR parameters associated with the resonant species. The "known" evolutions may be, for example, simulated evolutions calculated from physical principles and/or previously acquired evolutions. A large set of known evolutions may be stored in a dictionary.

Existing MRF techniques acquire a series of images by using random, pseudo-random, or otherwise varied acquisition parameters, instead of a fixed set of parameters as used in traditional MR imaging. The goal is to elicit different signal evolutions from each type of tissue so that the time-series signal at each image voxel has a unique representation that can be compared to a pre-calculated dictionary containing many or all expected signals. In certain MRF implementations, flip angle (FA) and repetition time (TR) varies from frame to frame to drive the signal in transient state that is highly sensitive to the relaxation parameters. Readout encoding gradients can also be varied to generate a spatial temporal incoherence that helps "see through" the highly aliased images by the template matching algorithm.

The volume (a slice in 2D method or a slab in 3D acquisition) excited by the RF pulse stays constant in MRF acquisition schemes. In-plane spatial resolution is determined by the maximum value of k-space that a readout-encoding gradient can generate. In order to achieve higher resolution, a larger k-space value must be generated, which generally requires a longer gradient readout because the gradient strength is limited in clinical MR scanners. This longer gradient readout can lead to geometrical distortion with echo planar trajectories, or severely blurred images with spiral trajectories.

Therefore, it would be desirable to provide new systems and methods for MRF that achieve greater resolution, without sacrificing overall duration of the acquisition or inducing undesired artifacts in the resulting images.

SUMMARY OF THE DISCLOSURE

The present disclosure addresses the aforementioned drawbacks by providing systems and methods for reduced field of view MR fingerprinting for parametric mapping.

In accordance with one aspect of the disclosure, a method for magnetic resonance fingerprinting (MRF) is provided. The method including steps comprising acquiring a plurality of MRF signals from a plurality of excitation volumes within a subject, wherein at least two of the plurality of excitation volumes differ in location within the subject, and wherein each of the excitation volumes partially overlap to form an overlap volume. The method also includes comparing the plurality of MRF signals acquired from the overlap volume with a dictionary of signal evolutions, determining one or more physical parameters of the overlap volume within the subject, and generating a report at least indicating the one or more physical parameters of the overlap volume within the subject.

In accordance with another aspect of the disclosure, a nuclear magnetic resonance (NMR) system is provided that is configured to perform a magnetic resonance fingerprinting (MRF) process. The system includes a magnet system configured to generate a polarizing magnetic field about at least a region of interest (ROI) of a subject arranged in the NMR system, a plurality of gradient coils configured to apply a gradient field to the polarizing magnetic field, and a radio frequency (RF) system configured to apply an excitation field to the subject and acquire MRF signal evolutions from the ROI. The system also includes a computer system comprising a processor and a memory, the memory having stored thereon instructions that, when executed by the processor, cause the processor to control the RF system and the plurality of gradient coils to acquire a plurality of signal evolutions from a plurality of excitation volumes within the ROI, wherein at least two of the plurality of excitation volumes differ in location within the ROI, and wherein each of the excitation volumes partially overlap to form an overlap volume. The processor is also caused to compare the plurality of MRF signal evolutions acquired from the overlap volume with a dictionary of signal evolutions and determine, based on the comparison with the dictionary, one or more physical parameters of the overlap volume within the ROI. The system further includes a display configured to display a report at least indicating the one or more physical parameters of the overlap volume within the ROI.

The foregoing and other aspects and advantages of the present disclosure will appear from the following description. In the description, reference is made to the accompanying drawings that form a part hereof, and in which there is shown by way of illustration a preferred embodiment. This embodiment does not necessarily represent the full scope of the invention, however, and reference is therefore made to the claims and herein for interpreting the scope of the invention.

DETAILED DESCRIPTION

Magnetic resonance fingerprinting ("MRF") is a technique that facilitates mapping of tissue or other material properties based on random or pseudorandom measurements of the subject or object being imaged. In particular, MRF can be conceptualized as employing a series of varied "sequence blocks" that simultaneously produce different signal evolutions in different "resonant species" to which the RF is applied. The term "resonant species," as used herein, refers to a material, such as water, fat, bone, muscle, soft tissue, and the like, that can be made to resonate using NMR. By way of illustration, when radio frequency ("RF") energy is applied to a volume that has both bone and muscle tissue, then both the bone and muscle tissue will produce a nuclear magnetic resonance ("NMR") signal; however, the "bone signal" represents a first resonant species and the "muscle signal" represents a second resonant species, and thus the two signals will be different. These different signals from different species can be collected simultaneously over a period of time to collect an overall "signal evolution" for the volume.

The measurements obtained in MRF techniques are achieved by varying the acquisition parameters from one repetition time ("TR") period to the next, which creates a time series of signals with varying contrast. Examples of acquisition parameters that can be varied include flip angle ("FA"), RF pulse phase, TR, echo time ("TE"), and sampling patterns, such as by modifying one or more readout encoding gradients. The acquisition parameters are varied in a random manner, pseudorandom manner, or other manner that results in signals from different materials or tissues to be spatially incoherent, temporally incoherent, or both. For example, in some instances, the acquisition parameters can be varied according to a non-random or non-pseudorandom pattern that otherwise results in signals from different materials or tissues to be spatially incoherent, temporally incoherent, or both.

From these measurements, which as mentioned above may be random or pseudorandom, or may contain signals from different materials or tissues that are spatially incoherent, temporally incoherent, or both, MRF processes can be designed to map any of a wide variety of parameters. Examples of such parameters that can be mapped may include, but are not limited to, longitudinal relaxation time ($T_1$), transverse relaxation time ($T_2$), main or static magnetic field map ($B_0$), and proton density ($\rho$). MRF is generally described in U.S. Pat. No. 8,723,518 and Published U.S. patent application Ser. No. 2015/0301141, each of which is incorporated herein by reference in its entirety.

The data acquired with MRF techniques are compared with a dictionary of signal models, or templates, that have been generated for different acquisition parameters from magnetic resonance signal models, such as Bloch equation-based physics simulations. This comparison allows estimation of the physical parameters, such as those mentioned above. As an example, the comparison of the acquired signals to a dictionary can be performed using any suitable matching or pattern recognition technique. The parameters for the tissue or other material in a given voxel are estimated to be the values that provide the best signal template matching. For instance, the comparison of the acquired data with the dictionary can result in the selection of a signal vector, which may constitute a weighted combination of signal vectors, from the dictionary that best corresponds to the observed signal evolution. The selected signal vector includes values for multiple different quantitative parameters, which can be extracted from the selected signal vector and used to generate the relevant quantitative parameter maps.

The stored signals and information derived from reference signal evolutions may be associated with a potentially very large data space. The data space for signal evolutions can be partially described by:

$$SE = \prod_{s=1}^{N_S} \prod_{i=1}^{N_A} \prod_{j=1}^{N_{RF}} R_i(\alpha) R_{RF_{ij}}(\alpha, \phi) R(G) E_i(T_1, T_2, D) M_0; \quad (1)$$

where SE is a signal evolution; $N_S$ is a number of spins; $N_A$ is a number of sequence blocks; $N_{RF}$ is a number of RF pulses in a sequence block; $\alpha$ is a flip angle; $\phi$ is a phase angle; $R_i(\alpha)$ is a rotation due to off resonance; $P_{RF_{ij}}(\alpha, \phi)$ is a rotation due to RF differences; $R(G)$ is a rotation due to a magnetic field gradient; $T_1$ is a longitudinal, or spin-lattice, relaxation time; $T_2$ is a transverse, or spin-spin, relaxation time; D is diffusion relaxation; $E_i(T_1, T_2, D)$ is a signal decay due to relaxation differences; and $M_0$ is the magnetization in the default or natural alignment to which spins align when placed in the main magnetic field.

While $E_i(T_1, T_2, D)$ is provided as an example, in different situations, the decay term, $E_i(T_1, T_2, D)$, may also include additional terms, $E_i(T_1, T_2, D,K)$ or may include fewer terms, such as by not including the diffusion relaxation, as $E_i(T_1, T_2)$ or $E_i(T_1, T_2, K)$. Also, the summation on "j" could be replace by a product on "j".

The dictionary may store signals described by, for example:

$$S_i = R_i E_i (S_{i-1}) \qquad (2);$$

where $S_0$ is the default, or equilibrium, magnetization; $S_i$ is a vector that represents the different components of magnetization, $M_x$, $M_y$, and $M_z$ during the $i^{th}$ acquisition block; $R_i$ is a combination of rotational effects that occur during the $i^{th}$ acquisition block; and $E_i$ is a combination of effects that alter the amount of magnetization in the different states for the $i^{th}$ acquisition block. In this situation, the signal at the $i^{th}$ acquisition block is a function of the previous signal at acquisition block (i.e., the $(i-1)^{th}$ acquisition block). Additionally or alternatively, the dictionary may store signals as a function of the current relaxation and rotation effects and of previous acquisitions. Additionally or alternatively, the dictionary may store signals such that voxels have multiple resonant species or spins, and the effects may be different for every spin within a voxel. Further still, the dictionary may store signals such that voxels may have multiple resonant species or spins, and the effects may be different for spins within a voxel, and thus the signal may be a function of the effects and the previous acquisition blocks.

Figure 1:
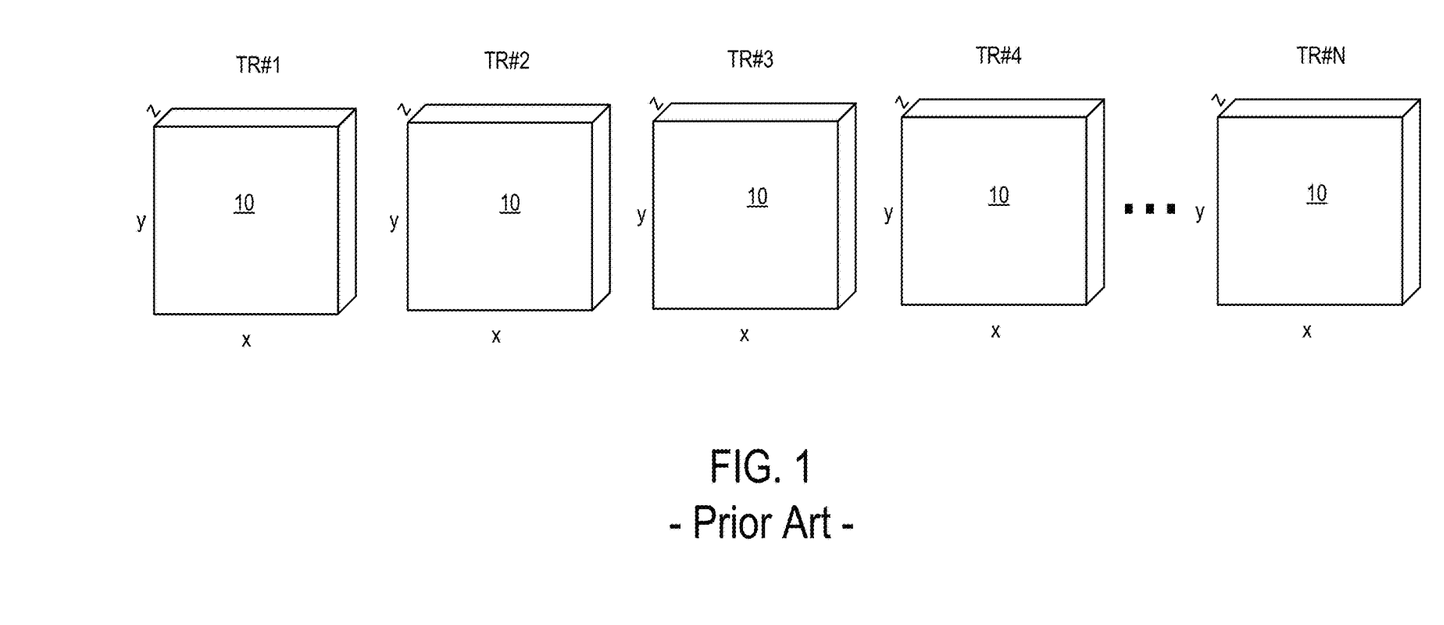
FIG. 1 is a schematic illustration of a traditional series of excitation volumes.

Referring to FIG. 1, an example prior art series of excitation volumes is illustrated, where the excitation volume remains constant for all TRs. That is, in a traditional MRF acquisition, a given volume is excited by an RF pulse as a constant volume. The volume may be a slice in 2D method or a slab in 3D acquisition.

Thus, as illustrated in FIG. 1, the volume 10 at TR#1, TR#2, TR#3, TR#4, and through TR#N is constant. Again, in this way, the in-plane spatial resolution is determined by the maximum value of k-space that a readout-encoding gradient can generate. Thus, in order to achieve higher resolution, a larger k-space value must be generated, which generally requires a longer gradient readout because the gradient strength is limited in clinical MR scanners. This longer gradient readout can lead to geometrical distortion with echo planar trajectories, or severely blurred images with spiral trajectories.

As will be described, the present disclosure provides an MRF framework that breaks from this paradigm. That is, the present disclosure provides systems and methods for reduced field of view MR fingerprinting for high-resolution parametric mapping.

Figure 2:
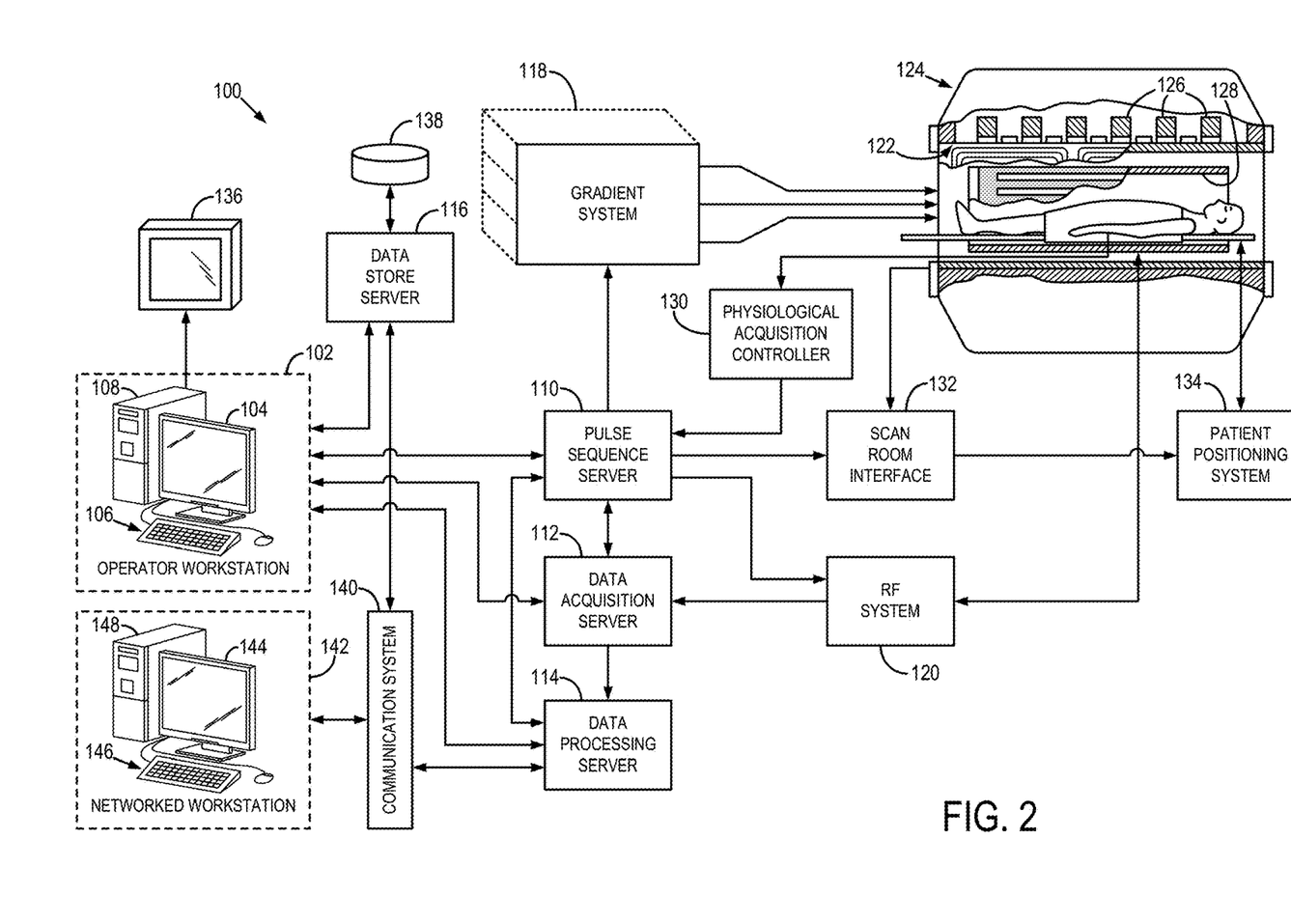
FIG. 2 is a block diagram of an example magnetic resonance imaging ("MRI") system that can implement the methods described in the present disclosure.

Referring particularly now to FIG. 2, an example of a nuclear magnetic resonance (NMR) or magnetic resonance imaging (MRI) system 100 that is configured to implement the methods described here is illustrated. The MRI system 100 includes an operator workstation 102 that may include a display 104, one or more input devices 106 (e.g., a keyboard, a mouse), and a processor 108. The processor 108 may include a commercially available programmable machine running a commercially available operating system. The operator workstation 102 provides an operator interface that facilitates entering scan parameters into the MRI system 100. The operator workstation 102 may be coupled to different servers, including, for example, a pulse sequence server 110, a data acquisition server 112, a data processing server 114, and a data store server 116. The operator workstation 102 and the servers 110, 112, 114, and 116 may be connected via a communication system 140, which may include wired or wireless network connections.

The pulse sequence server 110 functions in response to instructions provided by the operator workstation 102 to operate a gradient system 118 and a radiofrequency ("RF") system 120. Gradient waveforms for performing a prescribed scan are produced and applied to the gradient system 118, which then excites gradient coils in an assembly 122 to produce the magnetic field gradients $G_x$, $G_y$, and $G_z$ that are used for spatially encoding magnetic resonance signals. The gradient coil assembly 122 forms part of a magnet assembly 124 that includes a polarizing magnet 126 and a whole-body RF coil 128.

RF waveforms are applied by the RF system 120 to the RF coil 128, or a separate local coil to perform the prescribed magnetic resonance pulse sequence. Responsive magnetic resonance signals detected by the RF coil 128, or a separate local coil, are received by the RF system 120. The responsive magnetic resonance signals may be amplified, demodulated, filtered, and digitized under direction of commands produced by the pulse sequence server 110. The RF system 120 includes an RF transmitter for producing a wide variety of RF pulses used in MRI pulse sequences. The RF transmitter is responsive to the prescribed scan and direction from the pulse sequence server 110 to produce RF pulses of the desired frequency, phase, and pulse amplitude waveform. The generated RF pulses may be applied to the whole-body RF coil 128 or to one or more local coils or coil arrays.

The RF system 120 also includes one or more RF receiver channels. An RF receiver channel includes an RF preamplifier that amplifies the magnetic resonance signal received by the coil 128 to which it is connected, and a detector that detects and digitizes the I and Q quadrature components of the received magnetic resonance signal. The magnitude of the received magnetic resonance signal may, therefore, be determined at a sampled point by the square root of the sum of the squares of the I and Q components:

$$M = \sqrt{I^2 + Q^2} \qquad (3);$$

and the phase of the received magnetic resonance signal may also be determined according to the following relationship:

$$\varphi = \tan^{-1}\left(\frac{Q}{I}\right). \qquad (4)$$

The pulse sequence server 110 may receive patient data from a physiological acquisition controller 130. By way of example, the physiological acquisition controller 130 may receive signals from a number of different sensors connected to the patient, including electrocardiograph ("ECG") signals from electrodes, or respiratory signals from a respiratory bellows or other respiratory monitoring devices. These signals may be used by the pulse sequence server 110 to synchronize, or "gate," the performance of the scan with the subject's heart beat or respiration.

The pulse sequence server 110 may also connect to a scan room interface circuit 132 that receives signals from various sensors associated with the condition of the patient and the magnet system. Through the scan room interface circuit 132, a patient positioning system 134 can receive commands to move the patient to desired positions during the scan.

The digitized magnetic resonance signal samples produced by the RF system 120 are received by the data acquisition server 112. The data acquisition server 112 operates in response to instructions downloaded from the operator workstation 102 to receive the real-time magnetic resonance data and provide buffer storage, so that data is not lost by data overrun. In some scans, the data acquisition server 112 passes the acquired magnetic resonance data to the data processor server 114. In scans that require information derived from acquired magnetic resonance data to control the further performance of the scan, the data acquisition server 112 may be programmed to produce such information and convey it to the pulse sequence server 110. For example, during pre-scans, magnetic resonance data may be acquired and used to calibrate the pulse sequence performed by the pulse sequence server 110. As another example, navigator signals may be acquired and used to adjust the operating parameters of the RF system 120 or the gradient system 118, or to control the view order in which k-space is sampled. In still another example, the data acquisition server 112 may also process magnetic resonance signals used to detect the arrival of a contrast agent in a magnetic resonance angiography ("MRA") scan. For example, the data acquisition server 112 may acquire magnetic resonance data and processes it in real-time to produce information that is used to control the scan.

The data processing server 114 receives magnetic resonance data from the data acquisition server 112 and processes the magnetic resonance data in accordance with instructions provided by the operator workstation 102. Such processing may include, for example, reconstructing two-dimensional or three-dimensional images by performing a Fourier transformation of raw k-space data, performing other image reconstruction algorithms (e.g., iterative or backprojection reconstruction algorithms), applying filters to raw k-space data or to reconstructed images, generating functional magnetic resonance images, or calculating motion or flow images.

Images reconstructed by the data processing server 114 are conveyed back to the operator workstation 102 for storage. Real-time images may be stored in a data base memory cache, from which they may be output to operator display 102 or a display 136. Batch mode images or selected real time images may be stored in a host database on disc storage 138. When such images have been reconstructed and transferred to storage, the data processing server 114 may notify the data store server 116 on the operator workstation 102. The operator workstation 102 may be used by an operator to archive the images, produce films, or send the images via a network to other facilities.

The MRI system 100 may also include one or more networked workstations 142. For example, a networked workstation 142 may include a display 144, one or more input devices 146 (e.g., a keyboard, a mouse), and a processor 148. The networked workstation 142 may be located within the same facility as the operator workstation 102, or in a different facility, such as a different healthcare institution or clinic.

The networked workstation 142 may gain remote access to the data processing server 114 or data store server 116 via the communication system 140. Accordingly, multiple networked workstations 142 may have access to the data processing server 114 and the data store server 116. In this manner, magnetic resonance data, reconstructed images, or other data may be exchanged between the data processing server 114 or the data store server 116 and the networked workstations 142, such that the data or images may be remotely processed by a networked workstation 142.

This disclosure provides systems and methods that vary the volume excited by the RF pulse from frame to frame to achieve high-resolution parametric mapping within a selected inner volume. With reduced volume achieved by the varying the RF excited volume, a shorter readout gradient or fewer total acquisitions could be used to get a higher spatial resolution.

Figure 3:
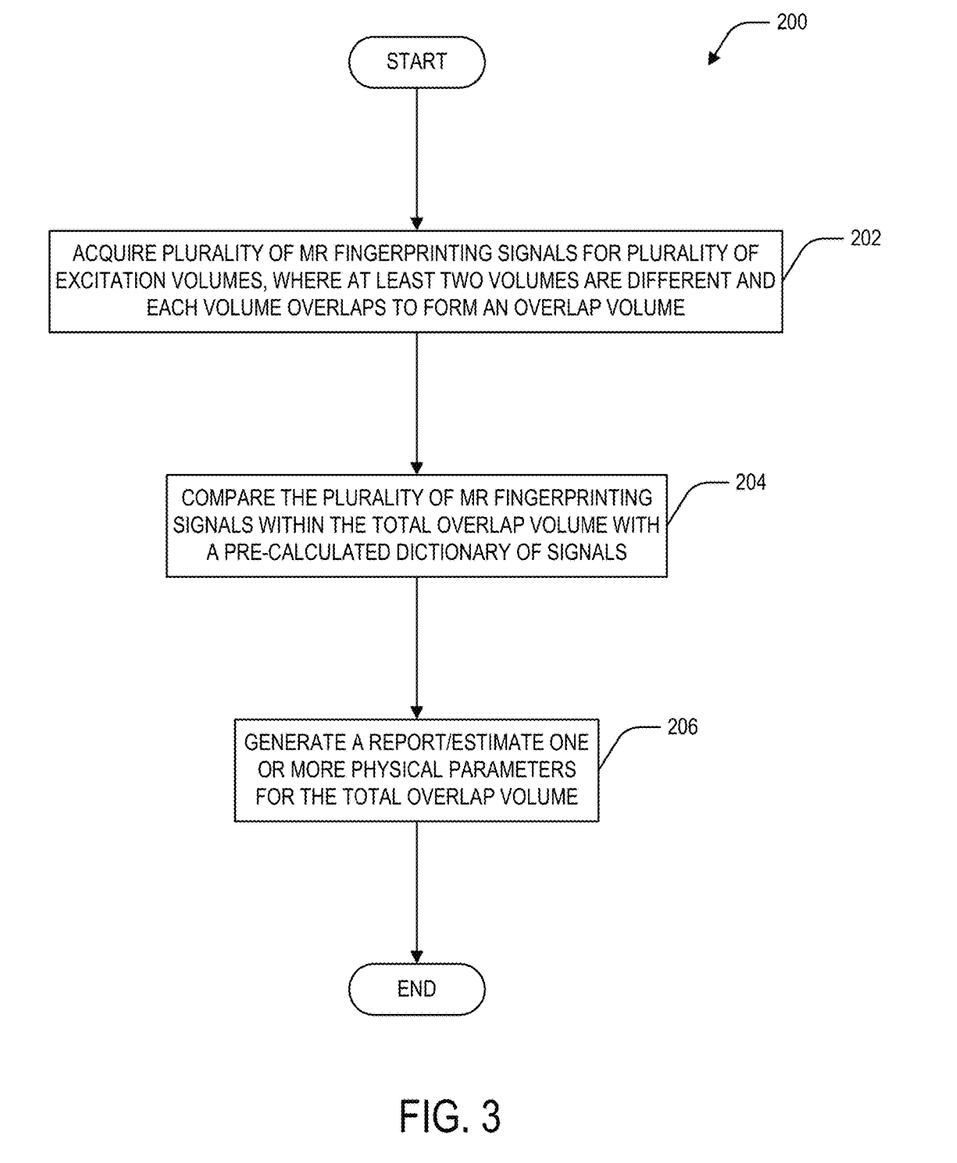
FIG. 3 is a flowchart illustrating a method in accordance with the present disclosure.

Referring to FIG. 3, the present disclosure provides a method 200 of high-resolution parametric mapping magnetic resonance (MR) fingerprinting. At process block 202, the method 200 can include acquiring a plurality of MR fingerprinting signals for a plurality of excitation volumes, wherein at least two of the plurality of excitation volumes are different volumes, and wherein each of the excitation volumes overlaps with an overlap volume. To perform process block 202, one non-limiting example may include alternating between a fixed excitation volume oriented in a first plane and a series of rotating excitation volumes that are orthogonal to the first plane and that rotate about an axis that is normal to the first plane, as will be illustrated. In another non-limiting example, a plurality of volumes are rotated relative to one another about a point in space to acquire the plurality of MRF signals from a plurality of excitation volumes within the subject.

Figure 4:
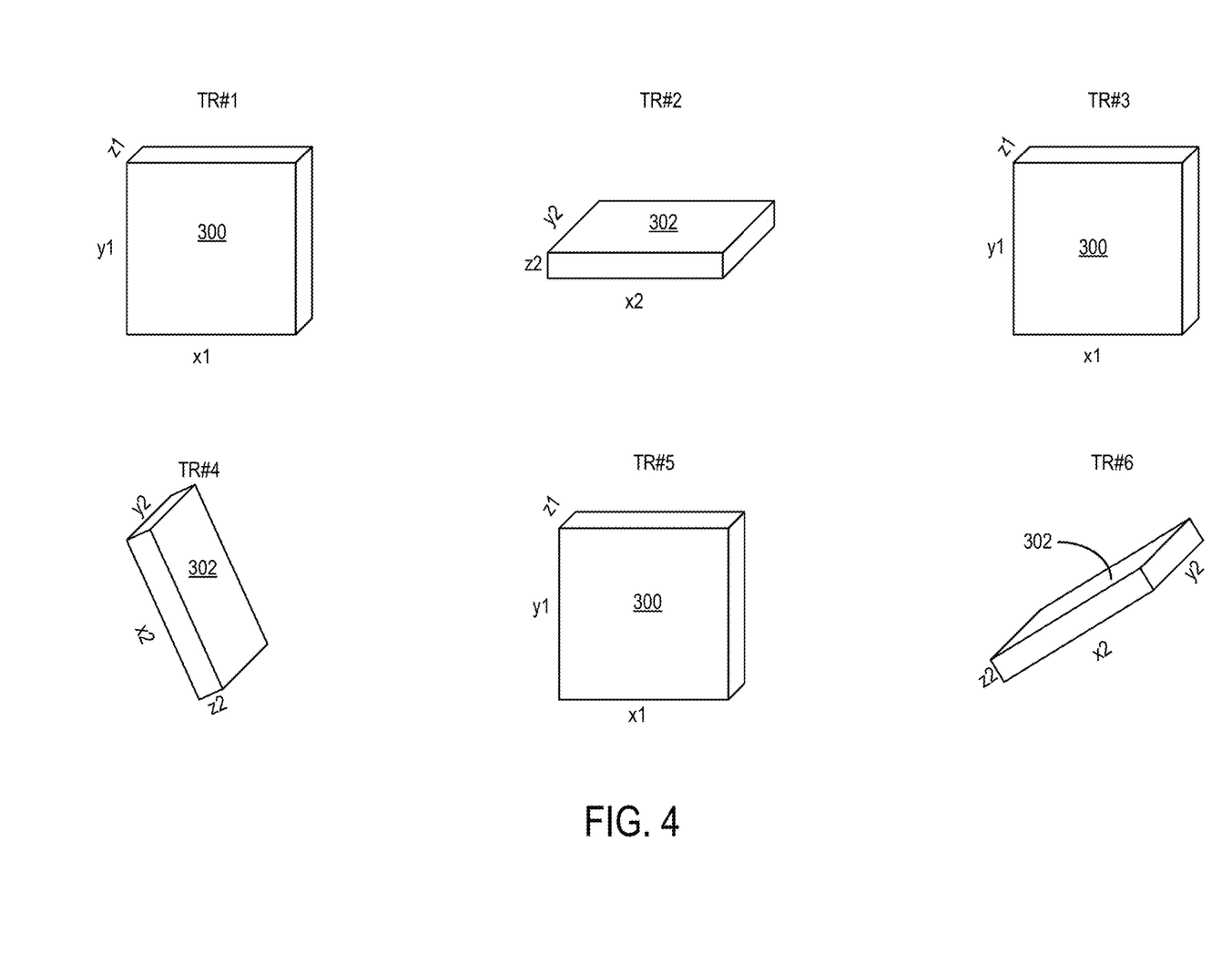
FIG. 4 is a series of excitation volumes illustrating one aspect in accordance with the present disclosure.

In particular, there are a variety of options that may be utilized to vary the imaging volume in accordance with the present disclosure. For example, referring to FIGS. 4 and 5, a first volume (x1*y1*z1) 300 can be excited in the TRs with odd numbers (#1,3,5, . . . ). In the TRs with even numbers (#2,4,6 . . . ), a different volume (x2*y2*z2) 302 can be excited that is orthogonal to the first volume 300 (i.e., the volume in the odd TRs). In addition to varying the volume 300, 302, each instance of the volume may be rotated by a desired angle from TR to TR. This rotation by a desired angle may be in a 2D space or a 3D space, as illustrated.

Figure 5:
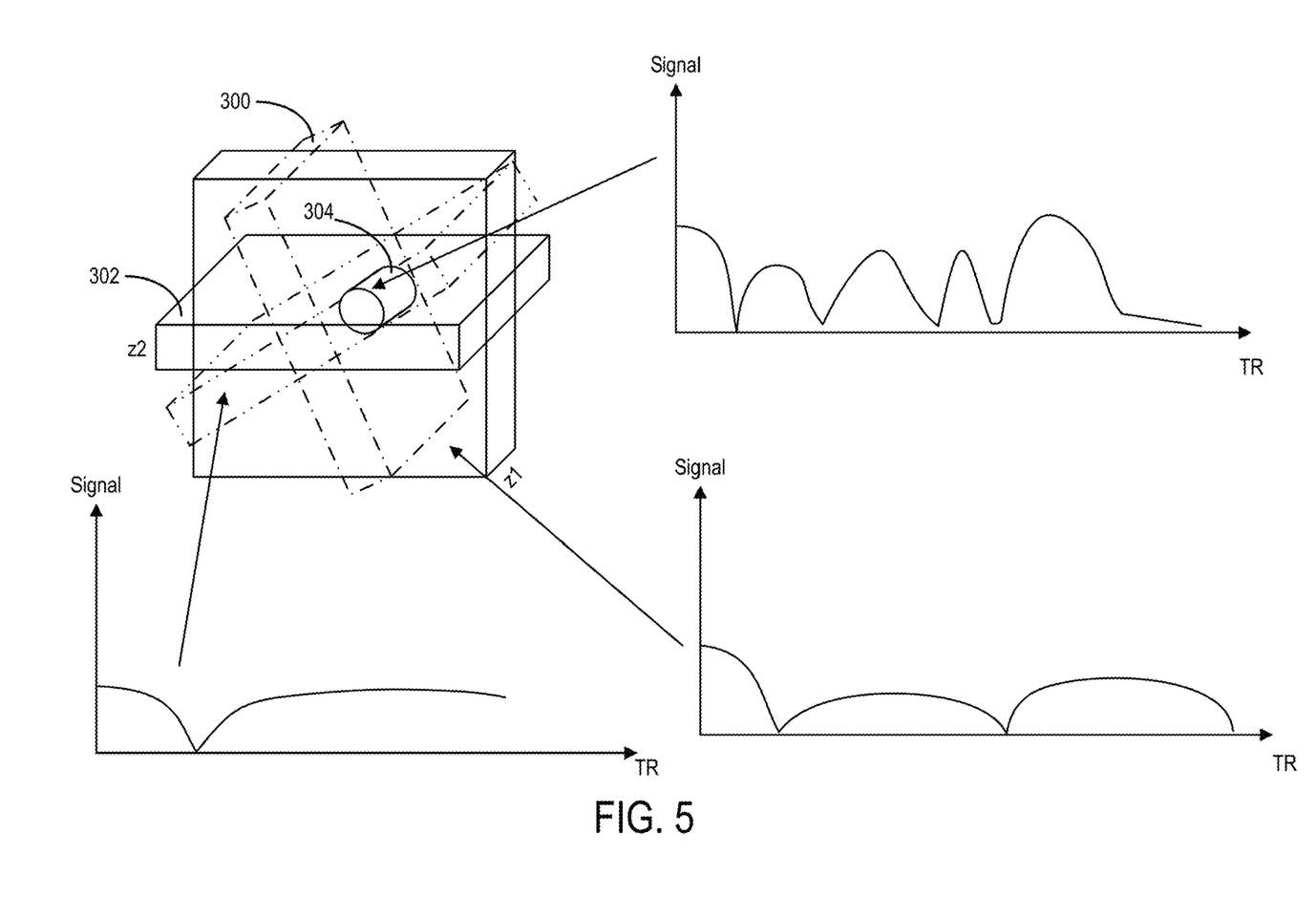
FIG. 5 is an illustration of the series of excitation volumes shown in FIG. 4 shown overlapping in space, along with a representation of the overlapping volume of those excitation volumes and example signals associated with various portions of the excitation volumes, in accordance with the present disclosure.

As illustrated in FIG. 5, after a selected number of TRs, the volumes 300, 302 can be assembled, virtually, to create an overlapping region 304. As more and more volumes 300, 302 are arranged, the overlapping region 304 forms a cylindrical, or approximately cylindrical, region with the length of z1, and the circle diameter of z2.

Because the data was acquired using an MRF pulse sequence, the signal evolutions are will be different in different regions. The cylindrical region 304 is the only region that will have data from all the RF excitations with pre-defined TRs. As such, the signal from the cylindrical region 304 reflects a collection of signal evolutions sufficient to match with the pre-calculated dictionary to accurately quantify the relaxation parameters. That is, other regions, such as an individual volume 300, 302 will not properly match to the dictionary. Additionally or alternatively, individual dictionaries can be constructed for all of the non-overlapping or small-overlapping regions as well to aid the separation.

In addition to the example presented here, the excited volumes from frame to frame can also be rotated in a 3D space. In this case, after a certain number of TRs, the overlapping region forms a spherically-shaped volume.

Referring again to FIG. 3, at process block 204, the method 200 can include comparing the plurality of MR fingerprinting signal evolutions acquired within the overlap volume with a predetermined dictionary of signals. At process block 206, the method 200 can include generating a report. The report may include, for example, estimating, using the comparing of process block 204, one or more physical parameters for the overlap volume. The one or more physical parameters may, for example, relaxation parameters, including T1, T1*, T2, T2*, T1-rho, and T2-rho; proton (spin) density; B0 (frequency offset); perfusion parameters, including CBF, CBV, and MTT; diffusion parameters (e.g., ADC); magnetic susceptibility; magnetization transfer and CEST related parameters; and other quantitative parameters that can be estimated based on a relationship with, or otherwise influenced by, varied acquisition parameters.

The present disclosure involves varying the excited volumes from frame to frame, in addition to the typical parameters that are varied from frame to frame (e.g., TR and FA), to achieve a reduced field of view MRF. With the reduced field of view achieved by these methods, a higher resolution parametric mapping can be achieved with a shorter readout gradient.

The present disclosure has described one or more preferred embodiments, and it should be appreciated that many equivalents, alternatives, variations, and modifications, aside from those expressly stated, are possible and within the scope of the invention.

The invention claimed is:

1. A method of magnetic resonance fingerprinting (MRF), the method including steps comprising:
   a) acquiring a plurality of MRF signals from a plurality of excitation volumes within a subject, wherein at least two of the plurality of excitation volumes differ in location within the subject, and wherein each of the excitation volumes partially overlap to form an overlap volume;
   b) comparing the plurality of MRF signals acquired from the overlap volume with a dictionary of signal evolutions;
   c) determining, using the comparing of step b), one or more physical parameters of the overlap volume within the subject; and
   d) generating a report at least indicating the one or more physical parameters of the overlap volume within the subject.

2. The method of claim 1, wherein the plurality of excitation volumes in the acquiring of step a) includes two-dimensional (2D) slices.

3. The method of claim 1, wherein step a) includes alternating between a fixed excitation volume oriented in a first plane and a series of rotating excitation volumes that are orthogonal to the first plane and rotate about an axis that is normal to the first plane.

4. The method of claim 1, wherein the overlap volume is substantially cylindrical in shape.

5. The method of claim 1, wherein the plurality of excitation volumes in the acquiring of step a) includes three-dimensional (3D) slabs.

6. The method of claim 5, wherein step a) includes exciting a plurality of volumes that are rotated relative to one another about a point in space to acquire the plurality of MRF signals from the plurality of excitation volumes within the subject.

7. The method of claim 1, wherein the overlap volume is substantially spherical in shape.

8. The method of claim 1, wherein the one or more physical parameters include at least one of relaxation parameters, B0 field parameters, perfusion parameters, diffusion parameters, magnetic susceptibility parameters, or magnetization transfer parameters.

9. A nuclear magnetic resonance (NMR) system configured to perform a magnetic resonance fingerprinting (MRF) process, the system comprising:
   a magnet system configured to generate a polarizing magnetic field about at least a region of interest (ROI) of a subject arranged in the NMR system;
   a plurality of gradient coils configured to apply a gradient field to the polarizing magnetic field;
   a radio frequency (RF) system configured to apply an excitation field to the subject and acquire MRF signal evolutions from the ROI;
   a computer system comprising a processor and a memory, the memory having stored thereon instructions that, when executed by the processor, cause the processor to:
      control the RF system and the plurality of gradient coils to acquire a plurality of signal evolutions from a plurality of excitation volumes within the ROI, wherein at least two of the plurality of excitation volumes differ in location within the ROI, and wherein each of the excitation volumes partially overlap to form an overlap volume;
      compare the plurality of MRF signal evolutions acquired from the overlap volume with a dictionary of signal evolutions;
      determine, based on the comparison with the dictionary, one or more physical parameters of the overlap volume within the ROI; and
   a display configured to display a report at least indicating the one or more physical parameters of the overlap volume within the ROI.

10. The system of claim 9, wherein the plurality of excitation volumes are formed by two-dimensional (2D) slices.

11. The system of claim 9, wherein the computer system is configured to control the RF system and the plurality of gradient coils to alternate between a fixed excitation volume oriented in a first plane in the ROI and a series of rotating excitation volumes in the ROI that are orthogonal to the first plane and rotate about an axis that is normal to the first plane.

12. The system of claim 9, wherein the overlap volume is substantially cylindrical in shape.

13. The system of claim 9, wherein the plurality of excitation volumes are formed by three-dimensional (3D) slabs.

14. The system of claim 13, wherein the computer system is configured to control the RF system and the plurality of gradient coils to excite a plurality of volumes that are rotated relative to one another about a point in space to acquire the plurality of MRF signal evolutions from the plurality of excitation volumes within the ROI.

15. The system of claim 9, wherein the overlap volume is substantially spherical in shape.

* * * * *

UNITED STATES PATENT AND TRADEMARK OFFICE
CERTIFICATE OF CORRECTION

PATENT NO. : 10,459,055 B2
APPLICATION NO. : 15/945594
DATED : October 29, 2019
INVENTOR(S) : Mark A. Griswold and Yun Jiang It is certified that error appears in the above-identified patent and that said Letters Patent is hereby corrected as shown below:

In the Claims

Claim 8, Column 10, Line 3, "BO" should be -B0-.

Signed and Sealed this
Fourteenth Day of February, 2023

Katherine Kelly Vidal
*Director of the United States Patent and Trademark Office*